United States Patent
Cheng et al.

(10) Patent No.: US 9,859,866 B2
(45) Date of Patent: Jan. 2, 2018

(54) SWITCHING POWER SUPPLY, EMI FILTER, COMMON MODE INDUCTOR AND WRAPPING METHOD FOR THE COMMON MODE INDUCTOR

(71) Applicant: Delta Electronics (Jiangsu) Ltd., Wujiang, Jiangsu Province (CN)

(72) Inventors: Tangqian Cheng, Wujiang (CN); Yingtao Gong, Wujiang (CN); Cong Liu, Wujiang (CN); Jianping Lu, Wujiang (CN); Long Zhang, Wujiang (CN)

(73) Assignee: Delta Electronics (Jiangsu) Ltd., Jiangsu Province (CN)

( * ) Notice: Subject to any disclaimer, the term of this patent is extended or adjusted under 35 U.S.C. 154(b) by 0 days.

(21) Appl. No.: 14/685,034

(22) Filed: Apr. 13, 2015

(65) Prior Publication Data

US 2015/0348699 A1   Dec. 3, 2015

(30) Foreign Application Priority Data

Jun. 3, 2014   (CN) .......................... 2014 1 0240854

(51) Int. Cl.
*H03H 7/01* (2006.01)
*H01F 41/08* (2006.01)
(Continued)

(52) U.S. Cl.
CPC ........... *H03H 7/427* (2013.01); *H01F 17/062* (2013.01); *H01F 41/08* (2013.01); *H03H 1/0007* (2013.01);
(Continued)

(58) Field of Classification Search
CPC .... H03H 7/427; H03H 7/0115; H03H 1/0007; H03H 2001/0035; H01F 41/08; H01F 2017/0093; H01F 17/062
(Continued)

(56) References Cited

U.S. PATENT DOCUMENTS 4,173,747 A * 11/1979 Grimes ................. H01F 27/322
                                                         336/206
5,726,611 A *  3/1998 Takagi ..................... H01F 17/06
                                                         333/181
(Continued)

FOREIGN PATENT DOCUMENTS

| CN | 1754232 A | 3/2006 |
| CN | 1998054 A | 7/2007 |

(Continued)

OTHER PUBLICATIONS

1st Office Action dated Dec 23,2016 by the CN Office.
Office Action dated Aug. 11, 2015 by the TW Office.
2nd Office Action dated Jun. 2, 2017 by the CN Office.

*Primary Examiner* — Rakesh Patel
(74) *Attorney, Agent, or Firm* — Yunling Ren

(57) ABSTRACT

The present disclosure provides a switching power supply, an EMI filter, a common mode inductor and a wrapping method for the common mode inductor. The common mode inductor includes: a magnetic core; two multilayered coil windings symmetrically wrapped around the magnetic core; and two isolation gaps each of which is formed in respective one of the two multilayered coil windings, and is configured to divide, by beginning from a first layer, the respective one of the multilayered coil windings into two wrapping areas.

14 Claims, 4 Drawing Sheets

(51) Int. Cl.
  *H03H 7/42* (2006.01)
  *H03H 1/00* (2006.01)
  *H01F 17/06* (2006.01)
  *H01F 17/00* (2006.01)

(52) U.S. Cl.
  CPC ............... *H01F 2017/0093* (2013.01); *H03H 2001/0035* (2013.01)

(58) Field of Classification Search
  USPC ........ 333/181–185; 336/84 R, 186, 214, 220
  See application file for complete search history.

(56) References Cited

U.S. PATENT DOCUMENTS

| | | | |
|---|---|---|---|
| 6,480,088 B2 | 11/2002 | Okamoto | |
| 6,735,097 B1 * | 5/2004 | Prasad | ................ H02M 1/4225 363/44 |

FOREIGN PATENT DOCUMENTS

| | | |
|---|---|---|
| CN | 201039660 Y | 3/2008 |
| CN | 202695057 U | 1/2013 |
| CN | 202839211 U | 3/2013 |
| CN | 202839238 U | 3/2013 |
| JP | 2007-180167 A | 7/2007 |
| JP | 2014-56861 A | 3/2014 |
| TW | 200623164 A | 7/2006 |
| TW | I281173 A | 5/2007 |

* cited by examiner

SWITCHING POWER SUPPLY, EMI FILTER, COMMON MODE INDUCTOR AND WRAPPING METHOD FOR THE COMMON MODE INDUCTOR

CROSS REFERENCE TO RELATED APPLICATION

This application is based upon and claims the benefit of priority from the prior Chinese Patent Application No. 201410240854.7 filed on Jun. 3, 2014, entitled "SWITCHING POWER SUPPLY, EMI FILTER, COMMON MODE INDUCTOR AND WRAPPING METHOD FOR THE COMMON MODE INDUCTOR", before Chinese State Intellectual Property Office, under 35 U.S.C. §119. The content of the above prior Chinese Patent Application is incorporated herein by reference in its entirety.

TECHNICAL FIELD

The present disclosure generally relates to the technical field of Electromagnetic Interference (EMI) suppression, and more particularly, to a common mode inductor, a wrapping method for a common mode inductor, and an EMI filter and a switching power supply which use the common mode inductor.

BACKGROUND

A switching power supply is a power supply which maintains a stable output voltage by controlling a ratio of on-to-off time of a switch. The switching power supply products are developing towards a direction of small type and high frequency, which results in difficulties in improvement of EMI noise in switching power supply products. A common mode inductor, as one of main components for suppressing EMI noise in a switching power supply, self characters of which have obvious influence on EMI noise suppression.

As shown in FIG. 1, an equivalent circuit diagram of a common mode inductor is illustrated. As shown in FIG. 2, a schematic structure diagram of a common mode inductor in conventional technologies proposed for improving EMI noise suppression capability of a common mode inductor is shown. The common mode inductor mainly includes a magnetic core 102 and two multilayered coil windings 101 (double-layered coil windings with a first layer coil winding 101A and a second layer coil winding 101B are shown in FIG. 2) symmetrically wrapped around the magnetic core. Furthermore, an isolation gap 103 is formed in each of the multilayered coil windings 101, and the isolation gap 103 is configured to divide, by beginning from a second layer coil winding 101B, each of the multilayered coil windings 101 into two wrapping areas. That is, no isolation gap is formed in a first layer coil winding 101A, and there is an isolation gap formed in the second layer coil winding 101B.

However, the EMI noise suppression capability of this common mode inductor still needs to be enhanced, which hampers the development of switching power supplies towards a direction of small type and high frequency.

SUMMARY

Aiming at least a part of the technical problems in the conventional technologies, the present disclosure provides a common mode inductor for providing better EMI noise suppression capability. Further, the present disclosure provides a wrapping method for a common mode inductor, an EMI filter and a switching power supply which use the common mode inductor.

Other properties and advantages of the present disclosure will become clear from the detailed description below, or may be partly appreciated by practice of the present disclosure.

According to a first aspect of the present disclosure, a common mode inductor is provided. The common mode inductor includes: a magnetic core; two multilayered coil windings symmetrically wrapped around the magnetic core; and two isolation gaps each of which is formed in respective one of the two multilayered coil windings, and is configured to divide, by beginning from a first layer, the respective one of the multilayered coil windings into two wrapping areas.

According to a second aspect of the present disclosure, a wrapping method for a common mode inductor is provided. The common mode inductor includes a first multilayered coil winding and a second multilayered coil winding. The method includes the steps of: disposing two isolation blocking sheets at different positions of a magnetic core; wrapping the first multilayered coil winding around the magnetic core, wherein the first multilayered coil winding is divided into two wrapping areas by one of the isolation blocking sheets; and wrapping the second multilayered coil winding around the magnetic core, wherein the second multilayered coil winding is divided into two wrapping areas by the other one of the isolation blocking sheets, wherein the first multilayered coil winding and the second multilayered coil winding are symmetrically wrapped.

According to a third aspect of the present disclosure, an EMI filter is provided. The EMI filter includes an anti-EMI filter circuit composed of resistors, inductors and capacitors which are coupled in series or in parallel. The inductors include the common mode inductor according to the first aspect of the present disclosure.

According to a fourth aspect of the present disclosure, an EMI filter, including an anti-EMI filter circuit composed of resistors, inductors and capacitors which are coupled in series or in parallel. The inductors include the common mode inductor by use of the wrapping method according to the second aspect of the present disclosure.

According to a fifth aspect of the present disclosure, a switching power supply is provided. The switching power supply includes the common mode inductor according to the first aspect of the present disclosure.

According to a sixth aspect of the present disclosure, a switching power supply is provided. The switching power supply includes the common mode inductor by use of the wrapping method according to the second aspect of the present disclosure.

According to a seventh aspect of the present disclosure, a switching power supply is provided. The switching power supply includes the EMI filter according to the first aspect of the present disclosure.

In the common mode inductor provided in the embodiments of the present disclosure, respective one of isolation gaps is formed in respective one of multilayered coil winding, and then the respective one of the multilayered coil windings is divided, by beginning from a first layer, into two wrapping areas by using the respective one of the isolation gaps. The practices have proven that the present disclosure may greatly improve the EMI noise suppression capability of a common mode inductor, as compared with the technical solution in the conventional technologies in which the isolation gap divides, by beginning from a second layer coil winding, one of the multilayered coil windings into two wrapping areas, and thereby the present disclosure may provide technical support for the development of switching power supplies towards the direction of small type and high frequency

BRIEF DESCRIPTION OF THE DRAWINGS

The above and other features and advantages of the present disclosure will become clear from detailed description of exemplary embodiments with reference to accompanying drawings.

DETAILED DESCRIPTION

Figure 1:
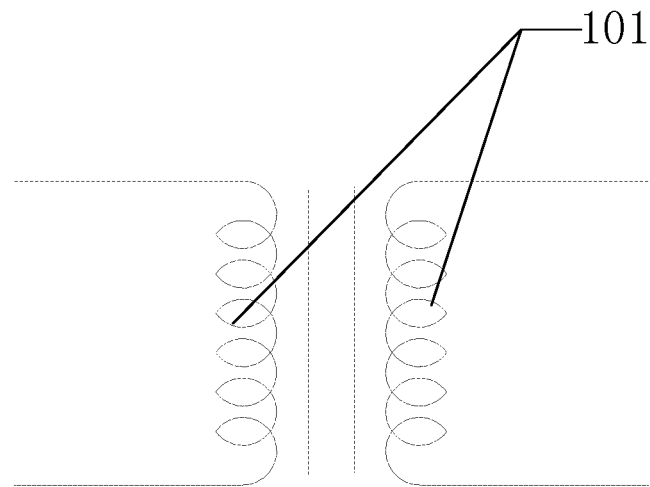
FIG. 1 is an equivalent circuit diagram of a common mode inductor.

Now, exemplary implementations will be described more comprehensively with reference to the accompanying drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to the ordinary skills in this art. In the drawings, thicknesses of areas and layers are exaggerated for the sake of clarity. Throughout the drawings similar reference numbers indicate the same or similar structures, and their detailed description will be omitted.

The features, structures or characteristics described herein may be combined in one or more embodiments in any suitable manner. In the following description, many specific details are provided to facilitate sufficient understanding of the embodiments of the present disclosure. However, the ordinary skills in this art will appreciate that the technical solutions in the present disclosure may be practiced without one or more of the specific details, or by employing other methods, elements, materials and so on. In other conditions, well-known structures, materials or operations are not shown or described in detail so as to avoid confusion of respective aspects of the present disclosure.

Figure 2:
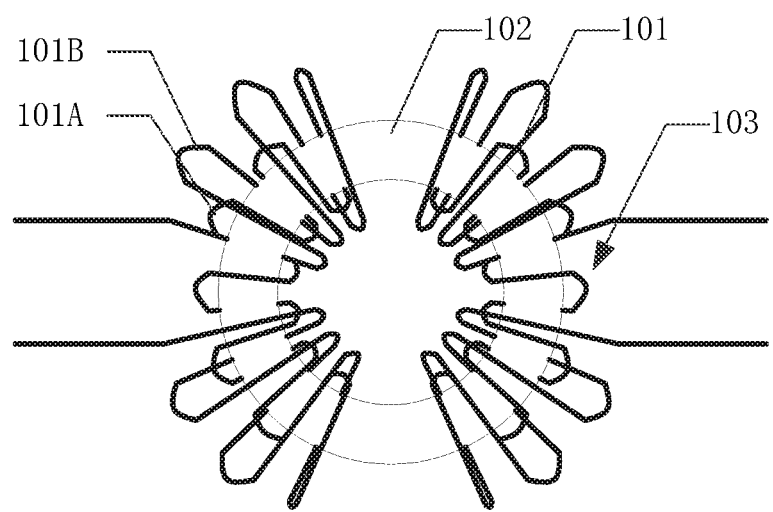
FIG. 2 is a schematic structure diagram of a common mode inductor in conventional technologies.

Switching power supply products in conventional technologies are developing towards a direction of small type and high frequency, which results in that a magnetic core in a common mode inductor cannot have an overlarge diameter. As shown in FIG. 2, due to the restriction of the diameter of the magnetic core 102, if it is needed to wrap a coil with a greater number of turns and a fixed number of layers around the magnetic core 102, the number of turns in each layer shall be increased. When the isolation gap 103 is formed, on one hand, the number of turns of the coil in other layers greatly depends on the number of turns of the coil in the first layer coil winding 101A; in order to wrap the greater number of turns of the coil, the number of turns of the first layer coil winding 101A needs to be increased as far as possible without forming an isolation gap in the first layer coil winding 101A; on the other hand, even though an isolation gap 103 is formed in the first layer coil winding 101A, the size of the isolation gap 103 is difficult to be controlled during the wrapping procedure due to deformation resulted from wire jumping, which may result in instability in product properties.

Figure 3:
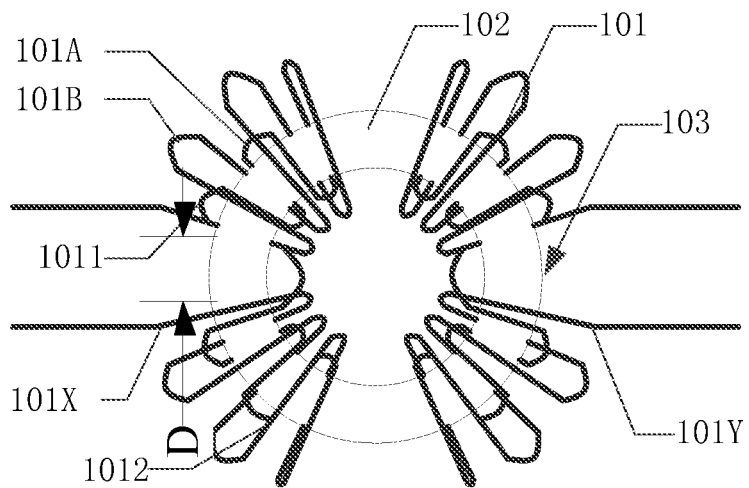
FIG. 3 is a schematic structure diagram of a common mode inductor according to an exemplary embodiment of the present disclosure.

In an exemplary embodiment, a common mode inductor is provided by overcoming the above technical prejudice. As shown in FIG. 3, the common mode inductor mainly includes a magnetic core 102, two multilayered coil windings 101 (including a first multilayered coil winding 101X and a second multilayered coil winding 101Y) symmetrically wrapped around the magnetic core 102 and two isolation gaps 103 each of which is formed in respective one of the multilayered coil windings 101. Each of the isolation gaps 103 is configured to divide, by beginning from a first layer coil winding 101A, the respective one of the multilayered coil windings 101 into two wrapping areas. The practices of the inventors of the present disclosure have proven that the present disclosure may greatly improve the EMI noise suppression capability of the common mode inductor, as compared with the technical solution in the conventional technologies in which each of the isolation gaps divides, by beginning from a second layer coil winding 101B, the respective one of the multilayered coil windings 101 into two wrapping areas. A part of the verification data is listed as follows.

Three groups (i.e., group A, group B and group C) of wrapping manners are designed. It is required that impedances of magnetic cores used in these groups do not greatly differ from each other. The number of samples in each group is 10 pcs (numbered as 1-10). One worker experienced in wrapping is chosen to wrap three groups of samples according to the specifications in Table 1.

TABLE 1

| Group | Group A | Group B | Group C |
| --- | --- | --- | --- |
| Isolation gap | No isolation gap formed | Width: 1 mm; divides, by beginning from a second layer, a coil winding into two wrapping areas | Width: 1 mm; divides, by beginning from a first layer, a coil winding into two wrapping areas |
| Wrapping specifications | Regular wrapping specifications; stacking wrapping | Regular wrapping specifications; stacking wrapping | Regular wrapping specifications; stacking wrapping |

TABLE 1-continued

| Group | Group A | Group B | Group C |
|---|---|---|---|
| Total number of turns (TS) | 60 | 60 | 60 |

Impedances of the three groups of samples are tested under an input signal frequency of 500 KHz, and data in Table 2 is obtained as follows.

TABLE 2

| No. | Impedance of Group A (KΩ) | Impedance of Group B (KΩ) | Impedance of Group C (KΩ) |
|---|---|---|---|
| 1 | 39.9 | 46.4 | 50.7 |
| 2 | 37.4 | 48.6 | 52.6 |
| 3 | 33.3 | 42.6 | 47.8 |
| 4 | 35.2 | 42.1 | 48.2 |
| 5 | 35.8 | 51.3 | 46.6 |
| 6 | 28.7 | 52.7 | 54.1 |
| 7 | 34.4 | 46.4 | 51.8 |
| 8 | 30 | 45.3 | 49.4 |
| 9 | 30.6 | 45.6 | 48.1 |
| 10 | 40.6 | 49.2 | 51.7 |
| Maximum Value | 40.6 | 52.7 | 54.1 |
| Minimum Value | 28.7 | 42.1 | 46.6 |
| Average Value | 34.59 | 47.02 | 50.1 |

Impedances of the three groups of samples are tested under an input signal frequency of 800 KHz, and data in Table 3 is obtained as follows.

TABLE 3

| No. | Impedance of Group A (KΩ) | Impedance of Group B (KΩ) | Impedance of Group C (KΩ) |
|---|---|---|---|
| 1 | 21 | 26.2 | 27.4 |
| 2 | 19.2 | 26.4 | 29.7 |
| 3 | 17.7 | 24 | 27.1 |
| 4 | 18.6 | 23.9 | 27.3 |
| 5 | 18.8 | 27.6 | 26.7 |
| 6 | 15.4 | 28.3 | 28.5 |
| 7 | 17.6 | 26.2 | 29.9 |
| 8 | 15.6 | 26.2 | 28.8 |
| 9 | 16.3 | 26.2 | 28.7 |
| 10 | 20.5 | 27.8 | 29.1 |
| Maximum Value | 21 | 28.3 | 29.9 |
| Minimum Value | 15.4 | 23.9 | 26.7 |
| Average Value | 18.07 | 26.28 | 28.32 |

It is obvious that the inductor in the present disclosure (i.e., the samples in Group C) may greatly improve the EMI noise suppression capability of the common mode inductor, as compared with the technical solution in conventional technologies (i.e., the samples in Group B) in which each of the isolation gaps divides, by beginning from a second layer coil winding 101B, the respective one of the multilayered coil windings 101 into two wrapping areas.

It shall be pointed out that, although illustration is made in the exemplary embodiment using the example in which the multilayered coil winding 101 is a double-layered coil winding, a width D of the isolation gap is 1 mm and the magnetic core is a closed-loop-shaped magnetic core, it have been proven that the following technical solutions may also greatly improve the EMI noise suppression capability of the common mode inductor, that is, the multilayered coil winding 101 is a triple-layered coil winding, a quadruple-layered coil winding or a coil winding with more layers, the width D of the isolation gap is 2 mm or other widths (e.g., any width within 0.5 mm to 5 mm), the magnetic core is a non-closed magnetic core or the closed magnetic core is a closed-polygon-shaped magnetic core or a closed magnetic core having other shapes, and the isolation gap 103 divides, by beginning from the first layer coil winding 101A, one of the multilayered coil windings 101 into two wrapping areas.

As described above, if it is intended to achieve the above common mode inductor by the wrapping method in conventional technologies, the most possible manner is to reserve an isolation gap by experience of workers after they have wrapped the first wrapping area 1011, and then the second wrapping area 1012 is wrapped. However, during the wrapping procedure, wires in the first layer coil winding may become saggy and thus the reserved isolation gap may deform as the advancing of the wrapping procedure, which will result in difficulties in controlling of size of the isolation gap, thereby lead to instability in product properties.

Figure 4:
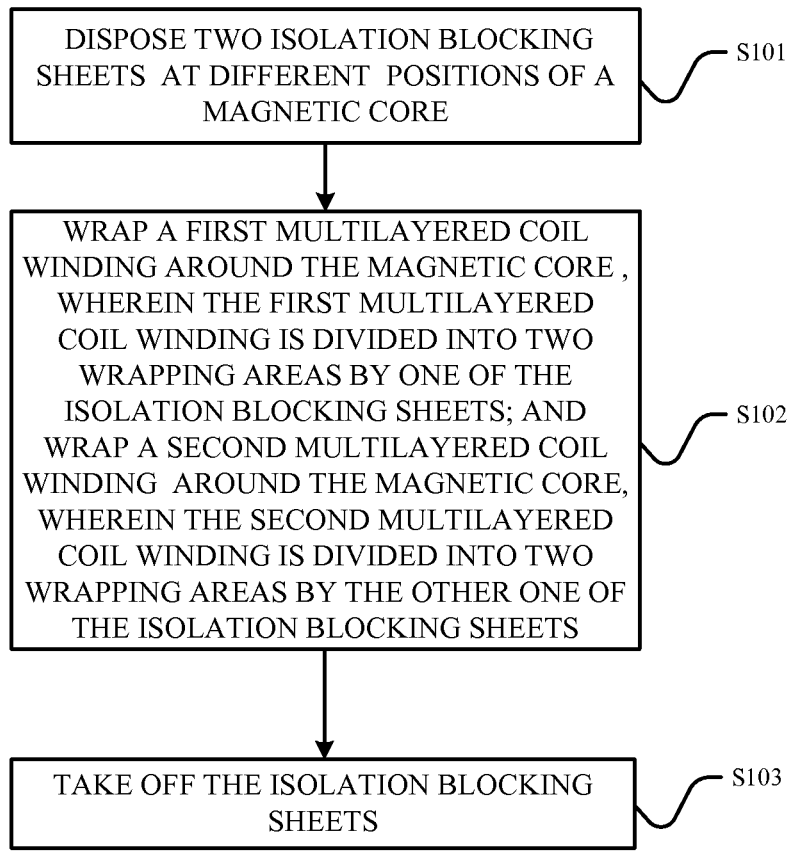
FIG. 4 is a schematic flowchart showing a wrapping method for a common mode inductor according to an exemplary embodiment of the present disclosure.

Thus, in an exemplary embodiment, a wrapping method for a common mode inductor is further provided. As shown in FIG. 4, the wrapping method for a common mode inductor mainly includes the following steps.

In step S101, two isolation blocking sheets are disposed at different positions of a magnetic core.

In step S102, a first multilayered coil winding 101X is wrapped around the magnetic core, wherein the first multilayered coil winding 101X is divided into two wrapping areas by one of the isolation blocking sheets; a second multilayered coil winding 101Y is wrapped around the magnetic core, wherein the second multilayered coil winding 101Y is divided into two wrapping areas by the other one of the isolation blocking sheets. The second multilayered coil winding 101Y and the first multilayered coil winding 101X are symmetrically wrapped. It shall be noted that the present disclosure does not impose specific limitations on the wrapping sequence of the first multilayered coil winding 101X and the second multilayered coil winding 101Y.

In addition to the above steps, the method may further include Step S103.

In step S103, the isolation blocking sheets are taken off. It shall be noted that not taking off the isolation blocking sheets is also applicable, which depends on actual conditions.

The above steps will be described in detail with reference to FIGS. 5~8.

Figure 5:
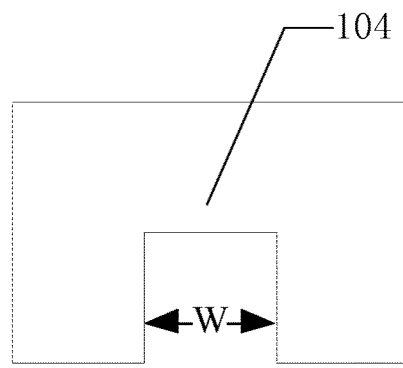
FIG. 5 is a schematic structure diagram of an isolation blocking sheet according to an exemplary embodiment of the present disclosure.
Figure 6:
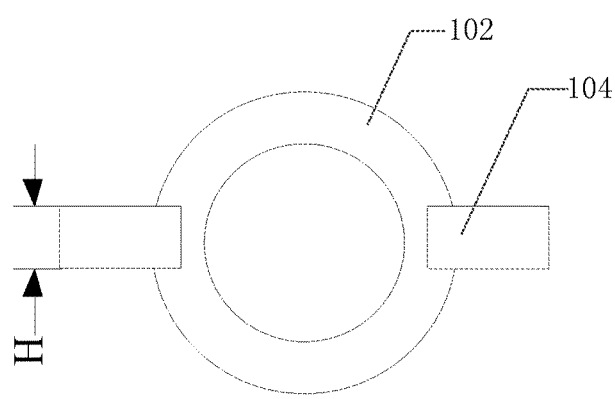
FIG. 6 is a schematic structure diagram after an assemblage of the isolation blocking sheet in FIG. 5 with a magnetic core.

FIG. 5 is a schematic structure diagram of an isolation blocking sheet according to an exemplary embodiment of the present disclosure. As shown in FIG. 5, an isolation blocking sheet 104 has a "⊔" shape. An opening width W of the isolation blocking sheet is substantially the same as a thickness of the magnetic core, and thus the isolation blocking sheet 104 may be assembled to the magnetic core in a snap-fit manner. As shown in FIG. 6, it is a schematic structure diagram after an assemblage of the isolation blocking sheet 104 with the magnetic core 102 in a snap-fit manner. It shall be noted that although the magnetic core 102 shown is a closed-ring-loop-shaped magnetic core, the present disclosure is not limited to this and a closed-polygon-shaped (e.g., rectangular-shaped) magnetic core or a closed magnetic core 102 having other shapes is also applicable.

The material of the isolation blocking sheet 104 may be non-magnetic material (such as organic material or alloy material) which may be coupled to the magnetic core 102 in a snap-fit manner or may be adhered to the magnetic core 102. In addition, considering the magnetic material of the magnetic core 102, the isolation blocking sheet 104 may also be formed of a magnetic material, i.e., the isolation blocking sheet 104 is magnetic. Indeed, the isolation blocking sheet 104 may also be made by ferromagnetic material. Thus, magnetic absorption force exists between the isolation blocking sheet 104 and the magnetic core 102, such that the isolation blocking sheet 104 may be fitted onto the magnetic core 102 by using this magnetic absorption force. Thus, the shape of the isolation blocking sheet 104 may be not limited to the above "⊔" shape, but may also be a "L" shape or other shapes such as a "U" shape or a "C" shape or a swallow tail shape. For example, when the isolation blocking sheet has a relatively large thickness H, due to a large contact area with the magnetic core 102, the applied force is more sufficient, thus, a "L" shape may be selected. When the isolation blocking sheet has a relatively small thickness H, a "U" shape may be selected to fix the isolation blocking sheet 104 by using a snap-fit force and a magnetic absorption force.

The thickness H of the isolation blocking sheet may be set depending on a size of the isolation gap to be formed. For example, a width of the isolation gap may be set as 0.5 mm~5 mm. For example, if a width D of the isolation gap to be formed is 1 mm, the thickness H of the isolation blocking sheet needs to be set as 1 mm; if a width D of the isolation gap to be formed is 2 mm, the thickness H of the isolation blocking sheet needs to be set as 2 mm, and so on.

The isolation blocking sheet 104 may be of an integrated structure, and the thickness of the isolation blocking sheet 104 may be determined when the isolation blocking sheet 104 is molded; or, for convenient adjustment of the thickness of the isolation blocking sheet 104, the isolation blocking sheet 104 may be constructed by stacking a plurality of thin sheet structures. For example, when a thickness of every thin sheet structure is 0.5 mm and a 2 mm-isolation blocking sheet 104 is needed, it only needs to stack four such thin sheet structures together. The connection manner between such thin sheet structures may be adhesive connections, or may be magnetic connections, and the present disclosure does not impose special limitations on this.

Figure 7:
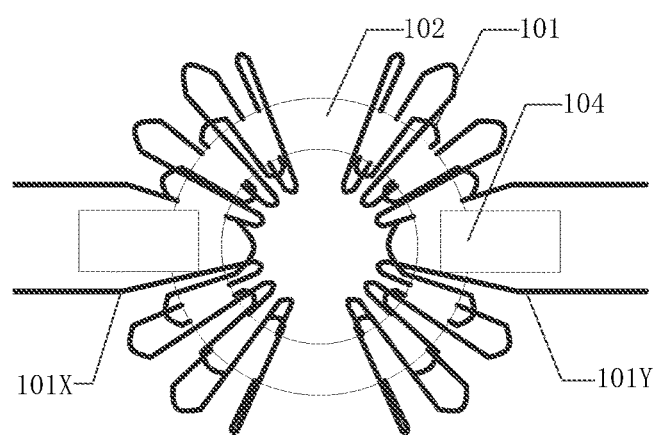
FIG. 7 is a schematic structure diagram after a wrapping around the magnetic core in FIG. 6.

After the isolation blocking sheets 104 is disposed at preset positions of the magnetic core 102, respective one multilayered coil winding may be wrapped around respective one of two half-rings of the magnetic core 102 respectively, and the number of layers, the wire diameter and the number of turns of the two multilayered coil windings are the same. As shown in FIG. 7, a schematic structure diagram after wrapping is shown. It can be seen that, during the wrapping procedure, the isolation blocking sheets 104 may maintain the shape of the isolation gap so as to avoid deformation of the isolation gap, and the size of the isolation gap may be stably controlled by selection of the thicknesses of the isolation blocking sheets 104. In addition, with the leading and assistance of the isolation blocking sheets 104, it is more convenient for wrapping operation, which brings benefits for increase of production efficiencies.

Figure 8:
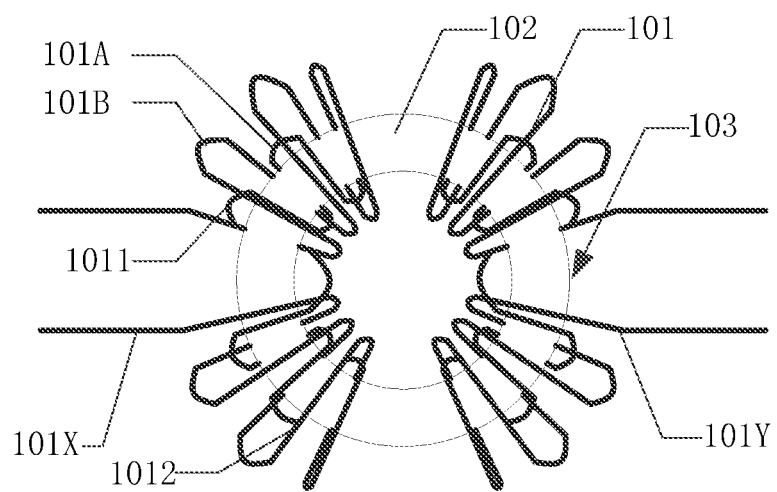
FIG. 8 is a schematic structure diagram of a common mode inductor prepared using the wrapping method for the common mode inductor of the present disclosure.

As shown in FIG. 8, after completion of wrapping, the isolation blocking sheets 104 may be taken off, and then an isolation gap 103 having a stable shape and a preset size is finally left. Thus, not only the EMI noise suppression capability of the common mode inductor is increased, but also stability in product properties is obtained. Indeed, the isolation blocking sheets 104 may not be taken off from the magnetic core 102 after completion of wrapping, so as to further ensure that the formed isolation gap 103 does not deform during usage of the common mode inductor and thus reliability of product performance is increased.

In an exemplary embodiment, an EMI filter is also provided. The EMI filter includes an anti-EMI filter circuit composed of inductors, capacitors and resistors which are coupled in series or in parallel, and the inductors include the above common mode inductor. Since the above common mode inductor has enhanced EMI noise suppression capability, it is possible to provide better EMI noise suppression capability for the EMI filter, and less dependency on other EMI suppression components may be achieved (e.g., the number of capacitors in the integrated filter circuit may be reduced and the capacitance amount may be decreased). Consequently, the EMI filter may have a simple structure design, such that space and production costs may be saved, which brings benefits for development of the EMI filter towards a direction of small type and high frequency.

In an exemplary embodiment, a switching power supply is provided. The switching power supply may be any power supply that is achieved by controlling on and off of a switch. For example, the switching power supply may be an Uninterruptible Power System (UPS), a communication power supply or a welding power supply, etc. The switching power supply in the present disclosure includes the above common mode inductor. Since the above common mode inductor has enhanced EMI noise suppression capability, it is possible to provide better EMI noise suppression capability for the switching power supply, and less dependency on other EMI suppression components may be achieved (e.g., the number of capacitors in the integrated switching power supply may be reduced and the capacitance amount may be decreased). Consequently, the switching power supply may have a simple structure design, such that space and production costs may be saved, which brings benefits for development of the switching power supply towards a direction of small type and high frequency.

The present disclosure is described with the above exemplary embodiments which are only examples for implementing the present disclosure. It shall be pointed out that the disclosed embodiments do not limit the scope of the present disclosure. Instead, modifications and variations without departing from the spirit and scope of the present disclosure fall into the protection scope of the present disclosure.

What is claimed is:

1. A common mode inductor, comprising:
   a magnetic core;
   two multilayered coil windings symmetrically wrapped around the magnetic core, wherein each of the two multilayered coil windings comprises a first layer immediately on the magnetic core and at least one second layer on the first layer; and
   two isolation gaps, each of which is formed in respective one of the two multilayered coil windings, and is configured to divide, by beginning from the first layer to the at least one second layer, the respective one of the two multilayered coil windings into two corresponding wrapping areas,
   wherein each of the two isolation gaps is formed by an isolation blocking sheet which is disposed between the two corresponding wrapping areas, and the isolation blocking sheet is detachable from the magnetic core.

2. A switching power supply, comprising the common mode inductor according to claim 1.

3. The common mode inductor according to claim 1, wherein each of the isolation blocking sheet has a thickness that is set depending on a size of the corresponding isolation gap to be formed.

4. The common mode inductor according to claim 3, wherein each of the isolation blocking sheet has a width of 0.5 mm~5 mm.

5. The common mode inductor according to claim 1, wherein the two isolation gaps have a width of 0.5 mm~5 mm.

6. The common mode inductor according to claim 1, wherein the magnetic core is a closed-loop-shaped magnetic core or a closed-polygon-shaped magnetic core.

7. A wrapping method for a common mode inductor, having a first multilayered coil winding and a second multilayered coil winding, the method comprising:
　disposing two isolation blocking sheets at different positions of a magnetic core;
　wrapping the first multilayered coil winding around the magnetic core, wherein the first multilayered coil winding is divided into two wrapping areas by one of the two isolation blocking sheets; and
　wrapping the second multilayered coil winding around the magnetic core, wherein the second multilayered coil winding is divided into two wrapping areas by the other one of the two isolation blocking sheets,
　wherein the first multilayered coil winding and the second multilayered coil winding are symmetrically wrapped, and after symmetrical wrapping the two multilayered coil windings around the magnetic core, the method further comprises:
　taking off the two isolation blocking sheets.

8. A switching power supply, comprising the common mode inductor by use of the wrapping method according to claim 7.

9. The method according to claim 7, wherein the two isolation blocking sheets are magnetic or comprise a ferromagnetic material.

10. The method according to claim 7, wherein the two isolation blocking sheets are of non-magnetic materials, and the two isolation blocking sheets are assembled to the magnetic core in a snap-fit manner, or adhered to the magnetic core.

11. The method according to claim 7, wherein the two isolation blocking sheets have a "⌴" shape or a "L" shape.

12. The method according to claim 7, wherein the two isolation blocking sheets are of an integrated structure or are constructed by stacking a plurality of thin sheet structures.

13. The method according to claim 7, wherein the two isolation blocking sheets have a thickness that is set depending on a size of a corresponding isolation gap to be formed.

14. The method according to claim 13, wherein each of the isolation gaps has a width of 0.5 mm~5 mm.

* * * * *